(12) United States Patent
Chen et al.

(10) Patent No.: US 7,884,473 B2
(45) Date of Patent: Feb. 8, 2011

(54) METHOD AND STRUCTURE FOR INCREASED WIRE BOND DENSITY IN PACKAGES FOR SEMICONDUCTOR CHIPS

(75) Inventors: Hsien-Wei Chen, Sinying (TW); Shih-Hsun Hsu, Hsinchu (TW)

(73) Assignee: Taiwan Semiconductor Manufacturing Co., Inc., Hsin-Chu (TW)

( * ) Notice: Subject to any disclaimer, the term of this patent is extended or adjusted under 35 U.S.C. 154(b) by 105 days.

(21) Appl. No.: 11/850,283

(22) Filed: Sep. 5, 2007

(65) Prior Publication Data
US 2009/0057902 A1 Mar. 5, 2009

(51) Int. Cl.
*H01L 23/49* (2006.01)
(52) U.S. Cl. ................ 257/741; 257/784; 257/E23.024
(58) Field of Classification Search .......... 257/741, 257/784
See application file for complete search history.

(56) References Cited
U.S. PATENT DOCUMENTS

| | | | |
|---|---|---|---|
| 5,629,840 A * | 5/1997 | Hamburgen et al. | ........ 361/820 |
| 6,476,500 B2 | 11/2002 | Kimura | |
| 7,049,691 B2 | 5/2006 | Karnezos | |
| 7,253,518 B2 * | 8/2007 | Caletka et al. | .............. 257/734 |
| 2002/0079567 A1 | 6/2002 | Lo et al. | |
| 2006/0065958 A1 | 3/2006 | Tsao et al. | |

OTHER PUBLICATIONS

Corresponding Chinese application 20071019653.6 Office Action Aug. 12, 2010.

* cited by examiner

*Primary Examiner*—Evan Pert
*Assistant Examiner*—Krista Soderholm
(74) *Attorney, Agent, or Firm*—Duane Morris LLP

(57) ABSTRACT

A semiconductor package provides an IC chip on at least one package substrate and including signal bond pads, ground bond pads and power bond pads. The package substrate includes signal contact pads, ground contact pads and power contact pads which are respectively coupled to signal bond pads, ground bond pads and power bond pads formed on the IC chip. The contact pads are coupled to the associated bond pads by a bonding wire. The bonding wires that connect the power and ground pads have a thickness that is greater than the thickness of the bonding wires that couple the signal pads. The various bond pads on the IC chip may be staggered to provide for enhanced compactness and integration. The package substrates may be a plurality of stacked package substrates.

20 Claims, 4 Drawing Sheets

METHOD AND STRUCTURE FOR INCREASED WIRE BOND DENSITY IN PACKAGES FOR SEMICONDUCTOR CHIPS

FIELD OF THE INVENTION

The present invention relates to semiconductor packages and assemblies and methods for forming the same.

BACKGROUND

IC (integrated circuit) chips are semiconductor or other suitable chips that have an integrated circuit formed thereon. IC chips have microscopic input/output pads through which the integrated circuit is coupled to the outside world. The IC chips must be assembled in packages or other structures before being coupled to external devices and used in various applications. In the rapidly-advancing semiconductor manufacturing industry, and in the electronics industry as well, there is a push to increase integration levels and decrease device sizes. This is reflected in smaller and more compact IC chips and smaller components that combine to form the electronic devices in which the IC chips are used. As such, the packages that accommodate the chips must be accordingly miniaturized. Due to the increased complexity of each IC chip, the number of I/O (input/output) connections and pads also increases accordingly. Each I/O pad of the IC chip must be coupled to a conductive contact in the package in order to be coupled to other components, ground and power sources, and to provide and receive electrical signals to and from other components, i.e., communicate with the outside world. It is therefore a challenge to incorporate more input/output pads in a reduced area.

One of the shortcomings of advancing technology is that the need to provide smaller I/O pads and a smaller pitch for the I/O pads is limited by the wire dimensions of the wires typically used to connect the I/O pads of the IC chip to the package substrate. Gold is a commonly used bonding wire material. If the conventional, relatively thick bond wires are used and coupled to pads having a reduced pitch, the adjacent wires and pads can become shorted destroying device functionality. Conversely, the use of smaller wires will result in poor electric performance, for example increased resistance, when such wires are coupled to pads of reduced dimensions.

It would therefore be desirable to provide a bond pad arrangement having a reduced pitch, i.e., accommodating a greater number of I/O bond pads in a given area and increasing device and package complexity and compactness, without sacrificing degraded electrical performance or destruction of device functionality.

SUMMARY OF THE INVENTION

To address these and other needs and in view of its purposes, the present invention provides, in one aspect, a semiconductor package comprising a chip mounted on a substrate. The package includes a plurality of wires, each connecting a contact pad on the substrate to an associated bond pad on the chip. The plurality of wires include signal lines coupling signal contact pads on the substrate to signal bond pads on the chip and including a first thickness, and ground lines and power lines coupling ground contact pads and power contact pads, respectively, on the substrate to ground bond pads and power bond pads, respectively on the chip and including a second thickness. The second thickness is greater than the first thickness.

According to another aspect, the invention provides a semiconductor package comprising a chip mounted on a substrate. The package includes a plurality of wires, each connecting a contact pad on the substrate to an associated bond pad on the chip. The plurality of wires include signal lines coupling signal contact pads on the substrate to signal bond pads on the chip and including a first thickness, and ground lines and power lines coupling ground contact pads and power contact pads, respectively, on the substrate to ground bond pads and power bond pads, respectively on the chip and including a second thickness. The second thickness is greater than the first thickness and the ground and power bond pads on the chip are staggered with respect to the signal bond pads on the chip. The ground and power contact pads on the substrate have a pitch that is greater than the pitch of the signal contact pads formed on the substrate.

According to another aspect, the invention provides a semiconductor package comprising a chip mounted over at least two package substrates that may be stacked over one another. The semiconductor package includes a plurality of wires, each connecting a bond pad on the chip to an associated contact pad. The plurality of wires include signal lines coupling signal bond pads on the chip to signal contact pads and including a first thickness, ground lines coupling ground bond pads on the chip to ground contact pads and including a second thickness, and power lines coupling power bond pads on the chip to power contact pads and including the second thickness. The second thickness is greater than the first thickness and the at least two package substrates include an inner package substrate and a peripheral package substrate. Each of the signal contact pads, ground contact pads and power contact pads are disposed on one of the package substrates.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The present invention is directed to IC chips mounted in or on a semiconductor package and having bond pads thereon. The bond pads are electrically and physically coupled to contact pads on the package substrate via bond wires. The bond wires may be formed of the same or different materials and include different thicknesses. The semiconductor package may include one or more package substrates which may be stacked over one another in some embodiments.

Figure 1:
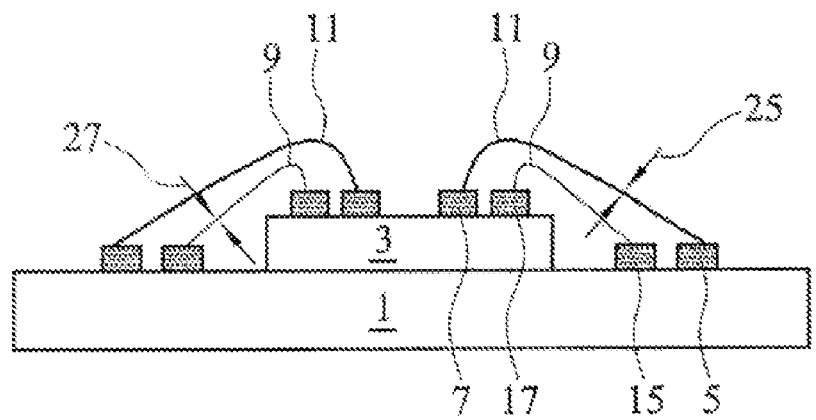
FIG. 1 is a cross-sectional, side view illustrating the various bond wires according to the invention.

Referring to FIG. 1, IC chip 3 is mounted on package substrate 1 and is centrally disposed in the illustrated embodiment. According to other exemplary embodiments, IC chip 3 may be disposed in locations other than the center of package substrate 1. According to other exemplary embodiments, IC chip 3 may be disposed within a recess formed in package substrate 1. IC chip 3 includes an integrated circuit or semiconductor device that may carry out any of various functions.

IC chip 3 includes a plurality of bond pads which function as the inputs/outputs of the integrated circuit/semiconductor device formed on IC chip 3. The bond pads include power/ground bond pads 7 and signal bond pads 17 in the illustrated embodiment and the respective bond pads may be formed of aluminum, gold, various metal alloys or other suitable conductive materials used in the semiconductor manufacturing industry. The bond pads are generally disposed peripherally with respect to IC chip 3 (see FIGS. 2-6) but can be disposed in any location according to the various embodiments of IC chips 3 that may be produced. In various exemplary embodiments such as will be illustrated in FIGS. 2-6, the bond pads are disposed in one or more rows that may be generally parallel to and proximate to the peripheral edges of IC chip 3. The inputs/outputs of a semiconductor device are connected to ground, power sources and signal lines. The bond wires that couple the bond pads on IC chip 3, to contact pads on package substrate 1 include signal lines 9 and power/ground lines 11. Power/ground lines 11 include thickness 25 which is greater than thickness 27 of signal lines 9. Power/ground lines 11 represent bond wires that couple power/ground bond pads 7 of IC chip 3 to a ground source or a power source through power/ground contact pads 5 formed on package substrate 1. That is, power/ground contact pads 5 represent pads that are coupled to a power or ground source. Signal lines 9 couple signal bond pads 17 of IC chip 3 to an electrical signal by way of signal contact pads 15 on package substrate 1. That is, signal contact pads 15 on package substrate 1 deliver and/or receive electrical signals to/from IC chip 3 via signal lines 9.

Signal lines 9 and power/ground lines 11 may be formed of the same or different materials and may be formed of gold, Al, AlCu, Cu, or other metal alloys or information-carrying media. Each of signal lines 9 and power/ground lines 11 may be considered bond or bonding wires. In various exemplary embodiments, thickness 25 of signal lines 11 may be about 1.1 to about four times as great as thickness 27 of signal lines 9. In one exemplary embodiment, thinner signal lines 9 may include a thickness no greater than about 0.5 or 0.6 mils and the thickness may be 0.4 mils in one exemplary embodiment. The relatively thicker power/ground lines 11 include thickness 25 which may be about 0.8 mils or greater. The relationship between the relatively thicker power/ground lines 11 and relatively thinner signal line 9 may be expressed as the ratio of the number of I/O lines, the ratio of the signal/power/ground lines being 4/1/1 according to an exemplary embodiment in which the power/ground lines 11 deliver a power of 100 watts and each signal line delivers a power of 25 watts. According to this embodiment in which 4 signal lines carry the equivalent power of one power line and one ground line, the power/ground lines 11 must be suitably larger than the corresponding signal lines 9. It can be seen that relatively thicker power/ground lines 11 overlap relatively thinner signal lines 9 in the illustrated embodiment.

Figure 2:
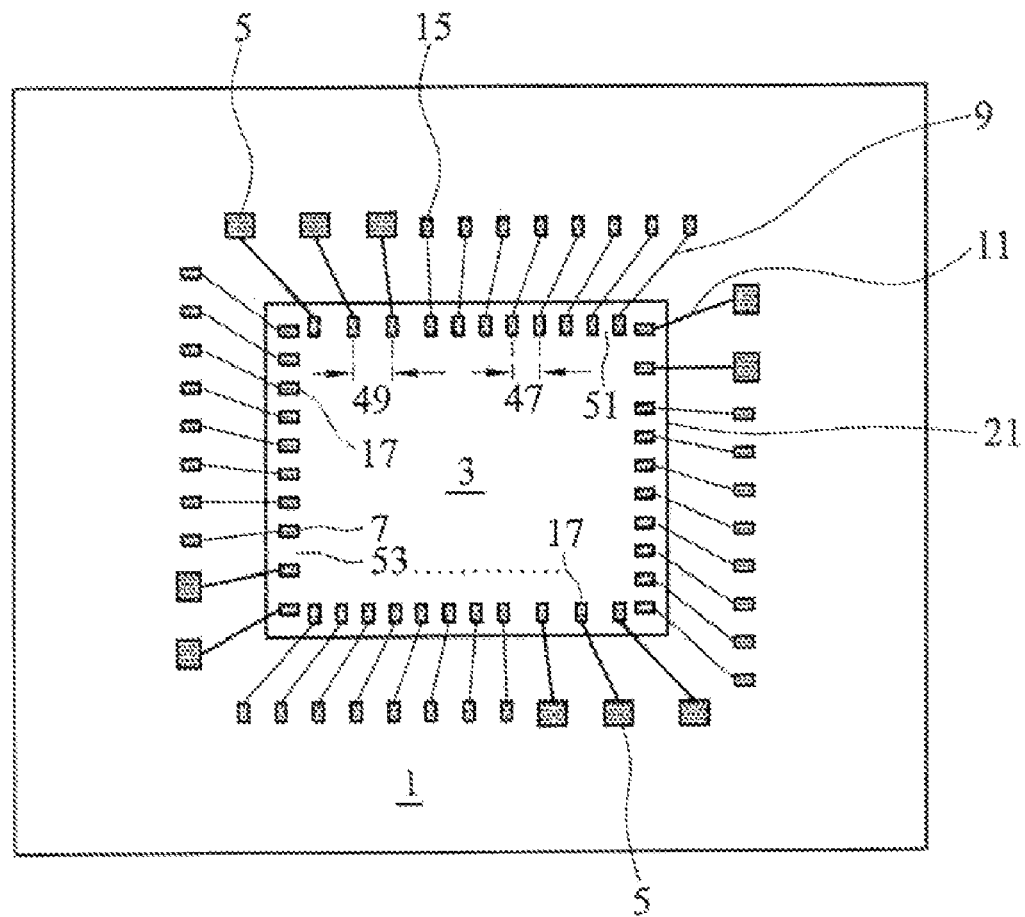
FIG. 2 is a top view showing various bond wire connections according to an exemplary embodiment of the invention.
Figure 3:
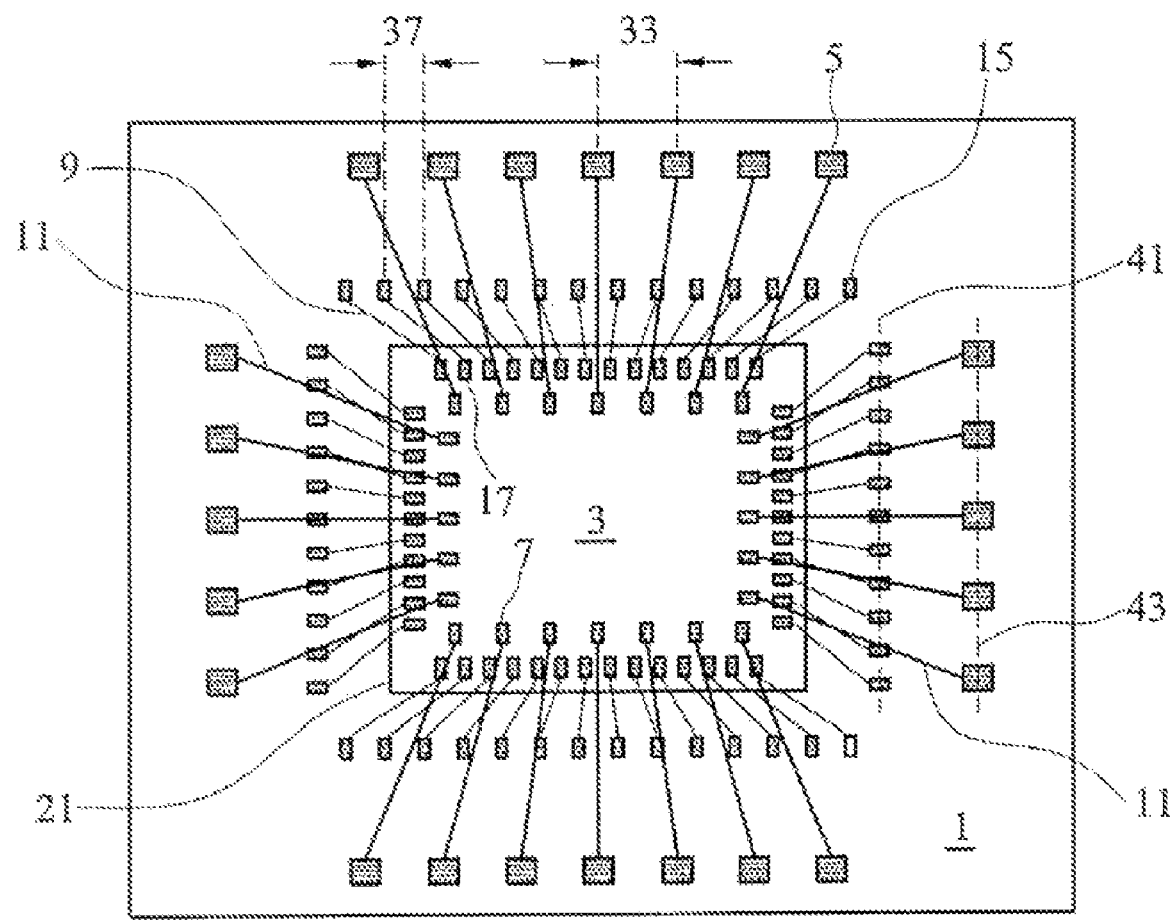
FIG. 3 is a top view showing various bond wire connections according to another exemplary embodiment of the invention.

FIGS. 2 and 3 are plan views showing various arrangements for coupling the contact pads 5 and 15 to bond pads 7 and 17. FIG. 2 shows the bond pads, including power/ground bond pads 7 and signal bond pads 17 forming a single peripheral row around each of the edges 21 of IC chip 3. In the illustrated embodiment of FIG. 2, contact pads 5 and 15 are arranged in a single row that extends outside each of edges 21 and no overlapping of bonding wires occurs. Power/ground bond pads 7 include a greater pitch than signal bond pads 17 and power/ground contact pads 5 include a greater pitch than signal contact pads 15.

FIG. 3 shows another exemplary arrangement of a semiconductor package including IC chip 3 centrally disposed on package substrate 1. The contact pads—power/ground contact pads 5 and signal contact 15 are disposed in a plurality of rows about peripheral edge 21 of IC chip 3. In particular, signal contact pads 15 are disposed in row 41 and power/ground contact pads 5 are disposed in row 43, external to row 41. As such, signal contact pads 15 that are disposed peripherally about IC chip 3 and power/ground contact pads 5 are disposed peripherally about signal contact pads 15. In many locations, power/ground lines 11 overlap signal lines 9. Pitch 33 of power/ground contact pads 5 is greater than pitch 37 of signal contact pads 15. FIG. 3 also illustrates an aspect of the invention that power/ground bond pads 7 are staggered with respect to signal bond pads 17. This feature is shown more clearly in FIG. 4.

Referring again to FIG. 2, pitch 49 of power/ground bond pads 17 is greater than pitch 47 of signal bond pads 17. In one exemplary embodiment, pitch 47 may be about 50 microns or less and pitch 49 may be 40 microns or greater. Spacing 51 between adjacent signal bond pads 17 will be generally less than spacing 53 between adjacent power/ground bond pads 7 in most exemplary embodiments. Spacing 51 between adjacent signal bond pads 17 may be about 35 microns or less and in one embodiment may be 9 microns. Spacing 53 between adjacent power/ground bond pads 7 may be about 6 microns or greater and may be about 44 microns in one embodiment. Such values are intended to be exemplary only.

Figure 4:
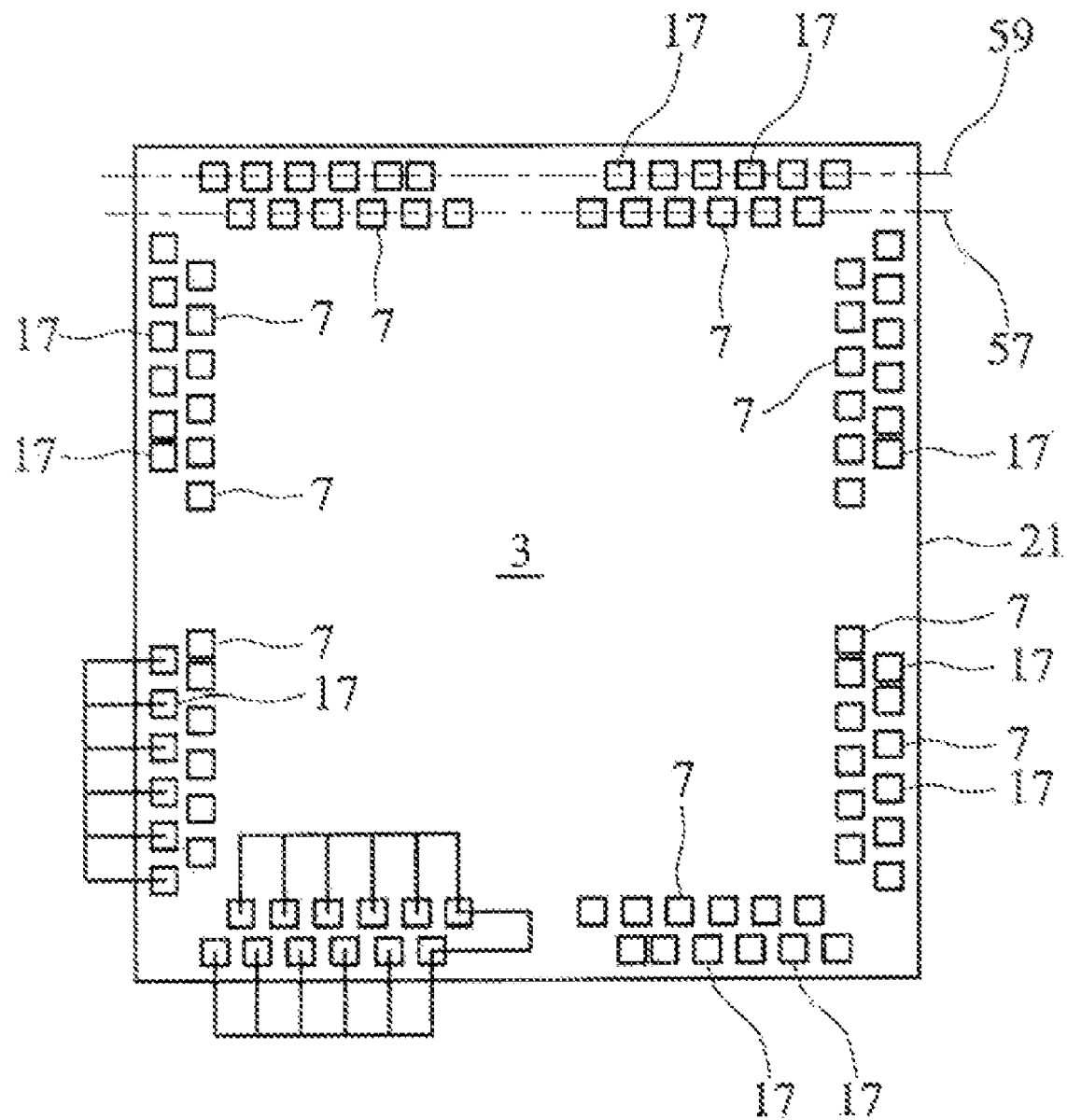
FIG. 4 is a top view showing an exemplary staggered bond pad arrangement according to the invention.

FIG. 4 shows signal bond pads 7 arranged in internal row 57 and power/ground bond pads 17 disposed in peripheral row 59 which is closer to peripheral edge 21 of IC chip 3 and it can be seen that signal bond pads 7 in internal row 57 are staggered with respect to power/ground bond pads 17 in row peripheral 59. The particular arrangement shown in FIG. 4 is intended to be exemplary only.

Figure 5:
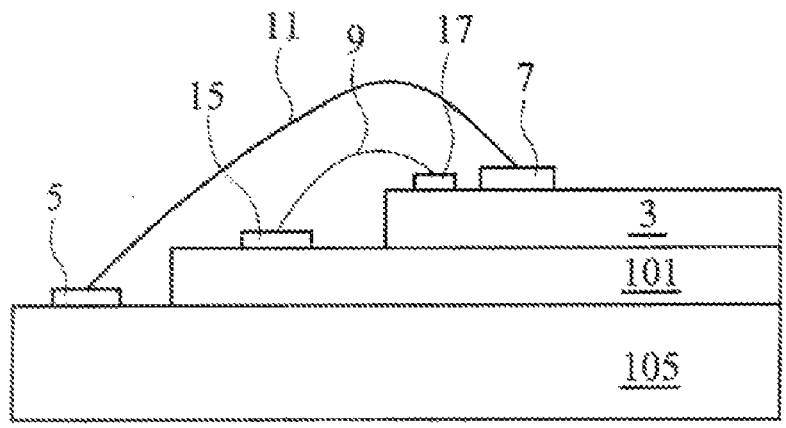
FIG. 5 is a cross-sectional, side view of another exemplary embodiment illustrating the various bond wires according to the invention.
Figure 6:
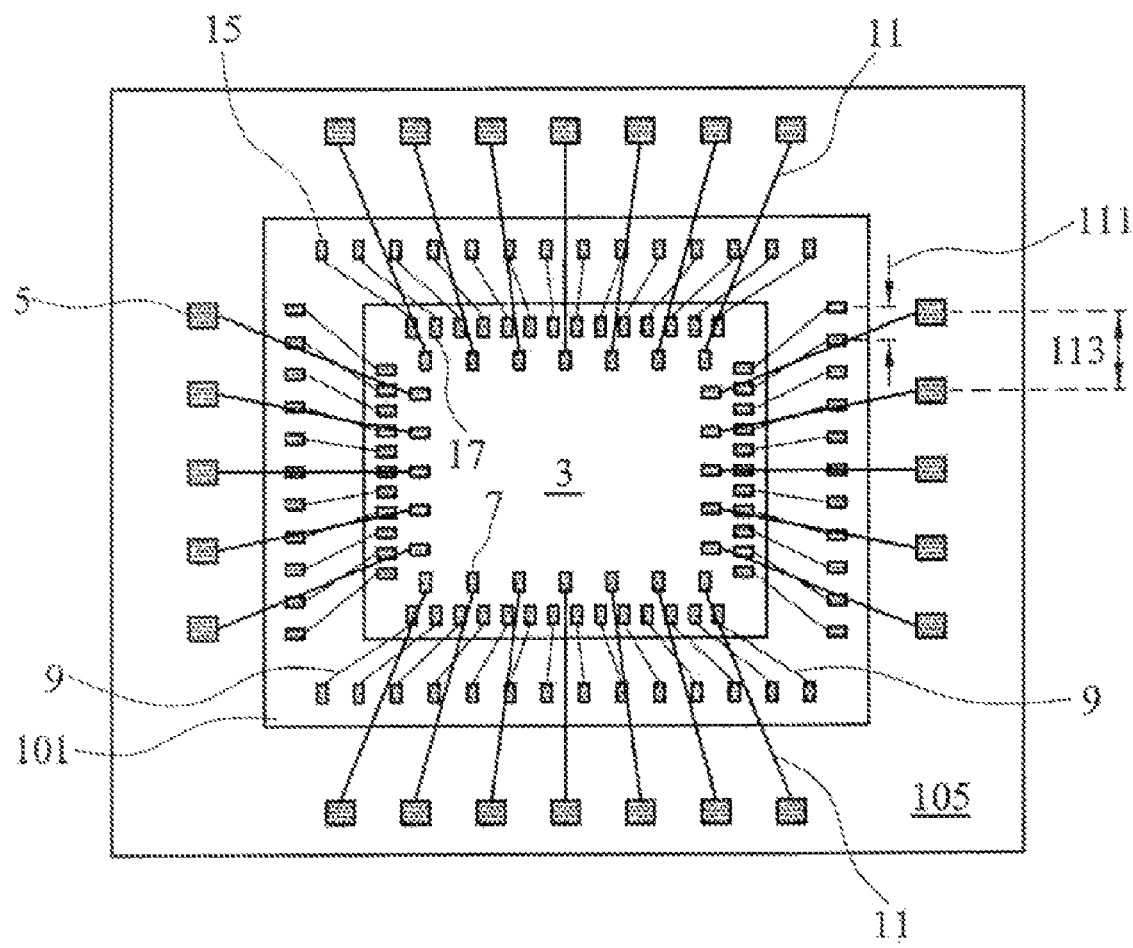
FIG. 6 is a top view showing various bond wire connections according to the exemplary embodiment shown in FIG. 5.

FIGS. 5 and 6 illustrate another exemplary embodiment according to the invention. According to this exemplary embodiment, IC chip 3 is mounted over stacked package substrates in the illustrated semiconductor package. The stacked package substrates include inner package substrate 101 and outer or peripheral package substrate 105. IC chip 3 is centrally disposed with respect to both inner package substrate 101 and peripheral package substrate 105 in the illustrated embodiment but according to other exemplary embodiments, IC chip 103 may be disposed in locations other than the center of the semiconductor package. IC chip 3 includes power/ground bond pads 7 and signal bond pads 17, both as previously described. In the illustrated embodiment, power/ground bond pads 107 are disposed in internal rows with signal bond pads 17 disposed in peripheral rows but other arrangements may be used in other exemplary embodiments.

Power/ground lines 11 and signal lines 9 are as previously described. In the illustrated embodiment, power/ground contact pads 5 are formed on peripheral package substrate 105 with signal contact pads 15 formed on inner package substrate 101. As such, power/ground contact pads 5 are disposed outside signal contact pads 15 and some of power/ground lines 11 extend over, i.e., overlap signal lines 9. According to other exemplary embodiments, IC chip 3 may be disposed on various other arrangements of one or more package substrates to form a semiconductor package according to the invention. Minimum pitch 111 of signal contact pads 115 disposed on inner package substrate 101 is less than minimum pitch 113 of power/ground contact pads 5 formed on peripheral substrate 105. In one exemplary embodiment, minimum pitch 111 may be 35 um and minimum pitch 113 may be 80 um but such dimensions are intended to be exemplary only.

The preceding merely illustrates the principles of the invention. It will thus be appreciated that those skilled in the art will be able to devise various arrangements which, although not explicitly described or shown herein, embody the principles of the invention and are included within its spirit and scope. For example, signal bond pads 17 and power/ground bond pads 7 may be disposed in different arrangements on IC chip 3. For example, they may be formed in the same row (FIG. 2) or in separate rows (FIGS. 3 and 4 and FIGS. 5 and 6). The same is true for power/ground contact pads 5 and signal contact pads 15. For example, rather than being distanced approximately the same distance from peripheral edge 21 of IC chip 3, as in FIG. 2 or whereby power/ground contact pads 5 are peripherally disposed about signal contact pads 15, according to another exemplary embodiment, signal contact pads 15 may be disposed peripherally about a row of contact pads that includes at least some power/ground contact pads 5. With respect to the stacked package substrate embodiments such as illustrated in FIGS. 5 and 6, various other exemplary embodiments may include inner package substrate 101 including both power/ground contact pads 5 and signal contact pads 15 and/or peripheral package substrate 105 may include both power/ground contact pads and/or signal contact pads 15. The illustrated embodiments are intended to be representative, and not limiting of the various arrangements of the invention.

Moreover, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. All statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor package comprising a chip mounted on a substrate and comprising:
   a plurality of wires, each connecting a contact pad on said substrate to an associated bond pad on said chip, said plurality of wires including:
   signal lines coupling signal contact pads on said substrate to signal bond pads on said chip and including a first thickness; and
   ground lines coupling ground contact pads on said substrate to ground bond pads on said chip and including a second thickness;
   power lines coupling power contact pads on said substrate to power bond pads on said chip and including said second thickness,
   said second thickness being greater than said first thickness.

2. The semiconductor package as in claim 1, wherein said second thickness is at least 1.1 times as great as said first thickness.

3. The semiconductor package as in claim 1, wherein said chip is internally disposed on said substrate, said signal contact pads are disposed peripherally around said chip and at least some of said ground contact pads and said power contact pads are peripherally disposed around said signal contact pads on said substrate.

4. The semiconductor package as in claim 3, wherein said first thickness is no greater than about 0.6 mils and said second thickness is no less than about 0.8 mils.

5. The semiconductor package as in claim 3, wherein at least some of said ground lines and said power lines overlap said signal lines.

6. The semiconductor package as in claim 1, wherein said ground bond pads and said power bond pads have a first pitch greater than a second pitch of said signal bond pads, said first pitch no less than about 40 microns and said second pitch no more than about 50 microns.

7. The semiconductor package as in claim 1, wherein said first thickness is about 0.4 mils and said second thickness is about 0.8 mils.

8. The semiconductor package as in claim 1, wherein at least some of said ground lines and said power lines overlap said signal lines.

9. The semiconductor package as in claim 1, wherein said signal lines, said ground lines and said power lines are each formed of gold.

10. The semiconductor package as in claim 9, wherein said first thickness is no greater than about 0.5 mils and said signal bond pads are spaced apart by an average spacing no greater than about 35 microns.

11. The semiconductor package as in claim 1, wherein said ground bond pads and said power bond pads have a second pitch being greater than a first pitch of said signal bond pads.

12. The semiconductor package as in claim 1, wherein said signal lines, said ground lines and said power lines are each formed of one of Al, AlCu and Cu.

13. A semiconductor package comprising a chip mounted on a substrate and comprising:
   a plurality of wires, each connecting a contact pad on said substrate to an associated bond pad on said chip, said plurality of wires including:

signal lines coupling signal contact pads on said substrate to signal bond pads on said chip and including a first thickness and said signal contact pads having a first pitch; and ground lines coupling ground contact pads on said substrate to ground bond pads on said chip and including a second thickness;

power lines coupling power contact pads on said substrate to power bond pads on said chip and including said second thickness, said second thickness being greater than said first thickness and said ground contact pads and said power contact pads having a second pitch greater than said first pitch, said ground bond pads and said power bond pads arranged in a first row and staggered with respect to said signal bond pads disposed in a second row adjacent said first row and disposed between said first row and a peripheral edge of said chip.

14. The semiconductor package as in claim 13, wherein said signal lines, said ground lines and said power lines are each formed of gold, said first thickness is no greater than about 0.5 mils and said signal bond pads are spaced apart by an average spacing no greater than about 35 microns.

15. The semiconductor package as in claim 13, wherein said chip is internally disposed on said substrate, said signal contact pads are disposed peripherally around said chip and said ground contact pads and said power contact pads are peripherally disposed around said signal contact pads on said substrate.

16. A semiconductor package comprising:

a chip mounted over at least two package substrates;

a plurality of wires, each connecting a bond pad on said chip to an associated contact pad, said plurality of wires including:

signal lines coupling signal bond pads on said chip to signal contact pads and including a first thickness; and ground lines coupling ground bond pads on said chip to ground contact pads and including a second thickness;

power lines coupling power bond pads on said chip to power contact pads and including said second thickness, said second thickness greater than said first thickness and said at least two package substrates including an inner package substrate and a peripheral package substrate, each of said signal contact pads, said ground contact pads and said power contact pads disposed on one of said package substrates.

17. The semiconductor package as in claim 16, wherein at least some of said ground lines and at least some of said power lines overlap said signal lines.

18. The semiconductor package as in claim 16, wherein said package substrates are stacked over one another and said second thickness is at least 1.1 times as great as said first thickness.

19. The semiconductor package as in claim 16, wherein said inner package substrate is disposed over said peripheral package substrate, said signal contact pads are disposed on said inner package substrate and said power contact pads and said ground contact pads are disposed on said peripheral package substrate.

20. The semiconductor package as in claim 16, wherein said ground bond pads and said power bond pads have a first pitch greater than a second pitch of said signal bond pads, said first pitch no less than about 40 microns and said second pitch no more than about 50 microns.

* * * * *

UNITED STATES PATENT AND TRADEMARK OFFICE
CERTIFICATE OF CORRECTION

| | | |
|---|---|---|
| PATENT NO. | : 7,884,473 B2 | Page 1 of 1 |
| APPLICATION NO. | : 11/850283 | |
| DATED | : February 8, 2011 | |
| INVENTOR(S) | : Hsien-Wei Chen et al. | |

It is certified that error appears in the above-identified patent and that said Letters Patent is hereby corrected as shown below:

Column 3, Line 46, delete "signal" and insert -- power/ground -- therefor.

Signed and Sealed this
Ninth Day of August, 2011

David J. Kappos
*Director of the United States Patent and Trademark Office*